(12) United States Patent
Nakatani

(10) Patent No.: US 6,878,635 B1
(45) Date of Patent: Apr. 12, 2005

(54) DRY ETCHING

(75) Inventor: Isao Nakatani, Ibaraki (JP)

(73) Assignees: National Institute for Materials Science, Ibaraki (JP); Japan Science and Technology Corporation, Saitama (JP)

( * ) Notice: Subject to any disclaimer, the term of this patent is extended or adjusted under 35 U.S.C. 154(b) by 0 days.

(21) Appl. No.: 09/857,258

(22) PCT Filed: Dec. 2, 1999

(86) PCT No.: PCT/JP99/06761

§ 371 (c)(1),
(2), (4) Date: Sep. 14, 2001

(87) PCT Pub. No.: WO00/33370

PCT Pub. Date: Jun. 8, 2000

(30) Foreign Application Priority Data

Dec. 2, 1998 (JP) .......................................... 10-343287

(51) Int. Cl.[7] ............................................ H01L 21/302
(52) U.S. Cl. ........................ 438/706; 438/710; 438/720; 216/58
(58) Field of Search ................................ 438/706, 710, 438/712, 720; 216/58, 64, 67, 73; 252/79.1

(56) References Cited

U.S. PATENT DOCUMENTS

| | | | | |
|---|---|---|---|---|
| 3,975,252 A | * | 8/1976 | Fraser et al. | ................. 204/192 |
| 5,122,225 A | * | 6/1992 | Douglas | ..................... 438/642 |
| 5,431,774 A | * | 7/1995 | Douglas | ...................... 216/57 |
| 5,694,184 A | * | 12/1997 | Yamada et al. | ................. 349/43 |
| 5,821,169 A | * | 10/1998 | Nguyen et al. | ............. 438/736 |
| 5,846,884 A | * | 12/1998 | Naeem et al. | .............. 438/714 |
| 6,605,541 B1 | * | 8/2003 | Yu | .............................. 438/700 |

* cited by examiner

*Primary Examiner*—Lan Vinh
(74) *Attorney, Agent, or Firm*—Wenderoth, Lind & Ponack, L.L.P.

(57) ABSTRACT

A metallic thin film of copper, silver, gold, or one alloy selected from alloys containing as a main component at least one of these metals is etched by plasma of an etching gas containing at least nitrogen oxide while being reacted with the plasma, whereby making it possible to fine-process electrically conductive materials, heat-transfer materials and electric-contact materials made of copper, silver, gold or an alloy containing as a main component at least one of these metals.

4 Claims, 3 Drawing Sheets

DRY ETCHING

This application is a 371 application of PCT/JP99/06761 filed Dec. 2, 1999.

TECHNICAL FIELD

The invention of the present application relates to a dry etching. More specifically, the invention of the present application relates to a dry etching method capable of fine processing an electrically conductive material, a heat transfer material, an electric contact material, etc., consisting of copper, silver, gold, or an alloy containing as a main component at least one of these metals.

BACKGROUND ART

In general, full advantage of lithography and etching technologies is taken in the field of electronic devices such as ultra LSIs or magnetic devices, and these devices are fabricated by combining these techniques.

The etching technique is a technique for fabricating a device which comprises transferring a resist pattern produced by lithography onto an object to be processed, i.e., to a semiconductor thin film, a magnetic thin film, etc., and includes methods such as wet-chemical etching method, argon ion milling method, and reactive ion etching method. Among these etching methods, reactive ion etching method is a kind of dry etching method, and is advantageous in that it enables a most precise transfer of patterns produced by lithography, and that it is suitable for fine processing. Moreover, it boasts superior etching rate. In view of such advantages, numerous large integrated circuits and semiconductor memories are fabricated by the reactive-ion etching method.

The reactive-ion etching method comprises placing the work piece in a plasma of a reactive gas while applying an electric field thereto, and physically and chemically stripping off successive layers of atoms by the incident ion beams that are irradiated vertically to the surface of the work piece. This method enables anisotropic processing cutting vertically along the boundary of the mask, and hence, it allows transfer of fine and sharp patterns.

In case of reactive-ion etching, firstly, the chemically active species such as the ions or radicals of the reactive gases that are generated in the plasma are adsorbed onto the surface of the work piece and undergo chemical reaction to form a layer of chemical products having a low bonding energy. Since the surface of the work piece are exposed to the impact of the positive ions that are accelerated in the plasma by an electric field and which are vertically incident to the surface, the surface layers that are loosely bonded are successively stripped off by the sputtering of ions or by the evaporation into vacuum. In this context, the reactive-ion etching process can be regarded as a process in which a chemical reaction and a physical process proceed simultaneously, and it is characterized by having a selectivity on a specific substance and having anisotropy as such to cut vertically into the surface of the object.

However, despite the superiority of the reactive-ion etching method over other methods, no effective means has been found for etching copper or gold that are widely used in the electronics, or for silver that is used in abundance as a heat conductive material or an electric contact material. The reason for this is that copper, silver, and gold undergo reaction with various types of etching gases such as $CF_4$, $CCl_4$, $CCl_2F_2$, $CClF_3$, $CBrF_3$, $Cl_2$, $C_2F_6$, $C_3F_8$, $C_4F_{10}$, $CHF_3$, $C_2H_2$, $SF_6$, $SiF_4$, $BCl_3$, $PCl_3$, $SiCl_4$, HCl, $CHClF_2$, etc., which are developed for etching semiconductor materials, and form reaction products with a bonding energy far higher than semiconducting materials. Thus, the reaction products are less apt to be subjected to a sputtering or an evaporation, and cannot be removed in a plasma.

Under the aforementioned circumstances, wet-chemical etching process or argon ion milling process has been conventionally applied to copper, silver, and gold to fabricate, for instance, a thin film magnetic head, a magnetic sensor, a micro transformer, etc. Furthermore, aluminum has been used for the electrodes and interconnections necessary for semiconductor devices by taking advantage of the ease in applying reactive-ion etching process at the expense of a high electric resistance and a high heat emission.

DISCLOSURE OF INVENTION

The invention of the present application has been made in the light of the aforementioned circumstances, and an object of the invention is to provide a dry-etching method capable of fine processing an electrically conductive material, a heat transfer material, an electric contact material, etc., consisting of copper, silver, gold, or an alloy containing as a main component at least one of these metals.

According to the invention of the present application, the above problems are solved by providing a dry-etching method comprising etching a metallic surface of copper, silver, gold, or an alloy containing as a main component at least one of these metals by plasma of an etching gas containing at least nitrogen oxide while being reacted with the plasma.

Furthermore, the invention of the present application provides, as a preferred embodiment, a dry-etching method in which the etching gas is a mixed gas of nitrogen oxide and hydrogen or a hydrogen-containing compound; in which the hydrogen-containing compound is one type or two or more types of compounds selected from the group consisting of ammonia, hydrocarbons, halogen-containing hydrocarbons, or hydrogen sulfide, and the mask material to be used in covering the metallic surface on etching is the one selected from the group consisting of titanium, titanium alloys, aluminum, or aluminum alloys.

Figure 1:
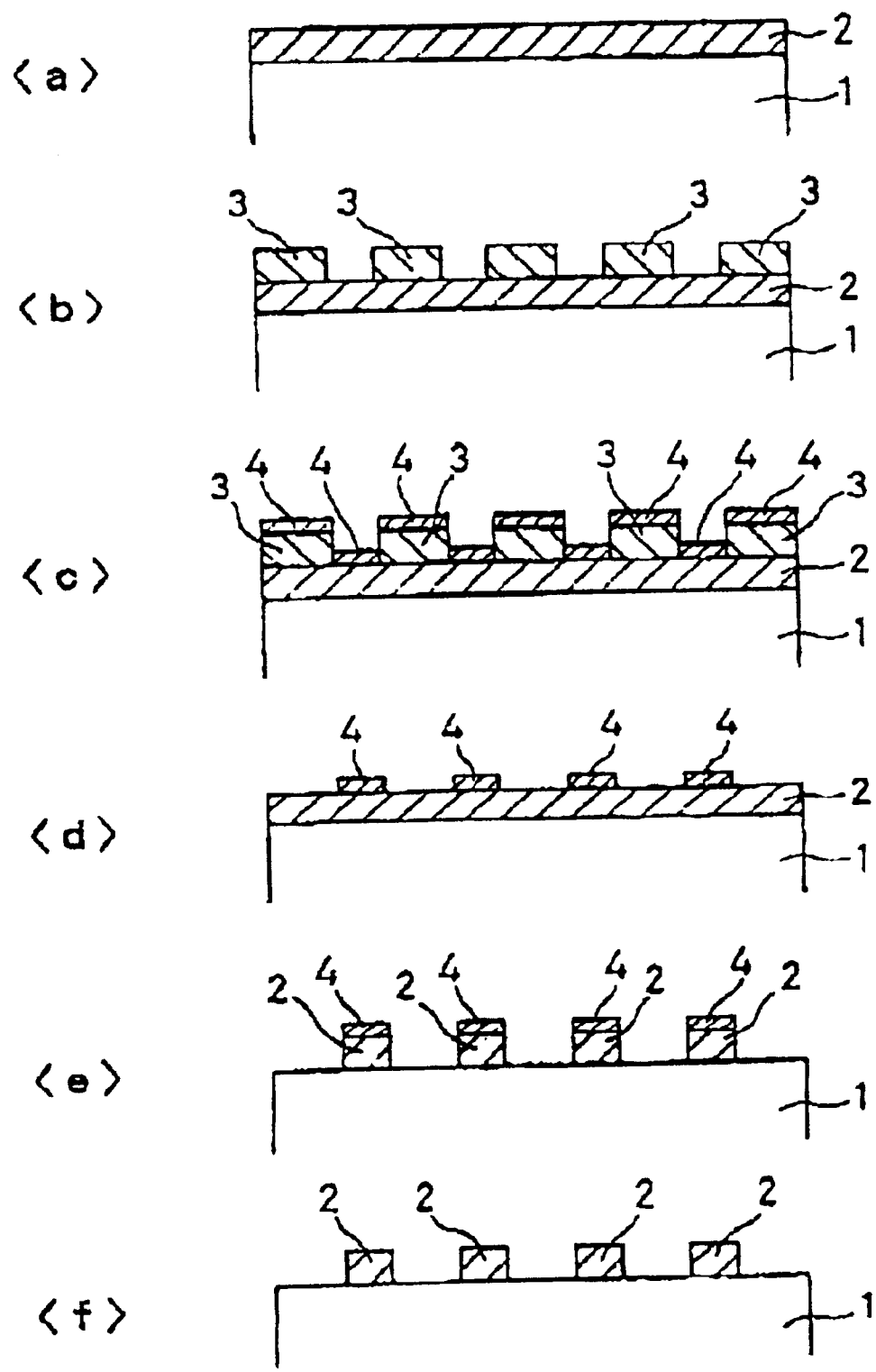
FIG. 1(*a*) to FIG. 1(*f*) are each a cross section view showing the dry-etching process stage in practicing the process according to the invention of the present application.

1 Glass substrate or a dielectric substrate
2 Metallic thin film
3 Resist
4 Mask
5 Reaction vessel
6 Deposition protection plate
7 High frequency electrode
8 Sample holder
9 Zero-potential shield

10 Counter electrode
11 Etching gas inlet
12 Etching gas
13 High voltage radio frequency power supply

BEST MODE FOR CARRYING OUT THE INVENTION

In the dry etching according to the invention of the present application, a metallic surface formed of copper, silver, gold, or one alloy containing as a main component at least one of these metals is etched by plasma of an etching gas containing at least nitrogen oxide while being reacted with the plasma. As described above, there is no particular limitation on the etching gas to be used in the process so long as it contains at least nitrogen oxide. The nitrogen oxide as referred herein includes nitrous oxide ($N_2O$), nitrogen monoxide (NO), and nitrogen dioxide ($NO_2$). Furthermore, the etching gases refer not only to pure gases, but they can be mixed gases containing other components. In case of a mixed gas, preferred as the other components to be mixed with nitrogen oxide is, for instance, hydrogen ($H_2$) or a compound containing hydrogen. As a compound containing hydrogen, there can be mentioned as examples, one or two or more of, ammonia ($NH_3$), a gaseous hydrocarbon such as methane ($CH_4$), a halogen-containing hydrocarbon (i.e., $CX_nH_{4-n}$, wherein X represents one or two or more types of a halogen element selected from F, Cl, Br, or I, and n represents an integer of 1 to 3), or hydrogen sulfide ($H_2S$). Among them, particularly hydrogen is preferred to other hydrogen-containing compounds. Hydrogen effectively allows nitrogen oxides such as $NO_2$ to contribute to the etching; more specifically, when compared with the other hydrogen-containing compounds under the same etching conditions, hydrogen increases the etching rate, and reduces the amount of hydrogen incorporated as an impurity into the object by decreasing the amount of hydrogen ions bombarded to the object during the etching process.

By using plasma of the etching gases, copper, silver, gold, or an alloy containing as a main component at least one of these metals can be subjected to etching, and an anisotropic selective processing which enables cutting along the boundary of the mask can be performed. Fine and sharp patterns can be thereby transferred. More specifically, because the etching gases contain at least nitrogen oxide, the bonding energy of the reaction products that are formed through the reaction of copper, silver, or gold in the plasma becomes sufficiently lower as compared with the case using etching gases conventionally used for semiconductor materials; hence, the reaction products are thereby rendered sensitive to the sputtering and easily removed. In this manner, reactive-ion, etching method is allowed to be applied to copper, silver, gold, or an alloy containing as a main component at least one of these metals, and these metals can be efficiently finely positioned at high precision and at a favorable etching rate.

Thus, the dry etching according to the invention of the present application is found effective in the fabrication of thin film coils for writing heads of magnetic disks, the fabrication of micro transducers or micro coils incorporated in magnetic integrated circuits, or in the fabrication of quantum effect devices such as spin scattering magnetoresistance device, spin-valve device, ferromagnetic tunneling device, spin field effect device, spin diode, spin transistor, etc., or in the fabrication of thin film coils for micro motors. Furthermore, the dry etching according to the invention of the present application is also effective in the fabrication of the interconnections among the devices assembled in three-dimensional large scale silicon integrated circuits such as CPUs and DRAMs produced from semiconductor silicon.

FIG. 1 is a diagram showing the cross section view of the practical process steps according to the invention of the present application.

<a> First, a metallic thin film (2) to be subjected to the fine processing, the metallic thin film being of copper, silver, gold, or an alloy consisting as a main component at least one of these metals, is formed on a glass substrate or a proper dielectric substrate (1) by means of, for instance, a sputtering method, a vacuum evaporating method, or a plating method, etc. The metallic thin film (2) to be processed can be formed at a thickness in a range of several nan meters (nm) to several micrometers ($\mu$m) depending on the design of the desired electromagnetic device.

<b> Then, a resist (3) is applied on the metallic thin film (2) by means of coating and the like. A fine pattern is then formed by means of electron beams lithography, ion beam lithography, photolithography, etc., followed by development.

<c> A mask (4) is formed thereafter by means of, for example, vacuum evaporation, etc., over the resist pattern thus formed.

<d> The resist (3) is then removed by dissolution by immersing the resulting product in an organic solvent. As a result, a fine mask (4) can be formed on the surface of the metallic thin film (2). The mask thus formed is provided in the shape of the desired device, for example, an electromagnetic device; more specifically, in a coil-like shape or in the shape of an electric contact pad or of an interconnection to be incorporated in the semiconductor large scale integrated circuit.

Mask materials can be properly selected from those capable of being subjected to an etching using a plasma of an etching gas containing at least nitrogen oxide, which are not consumed and have excellent stability. Among them, preferred are titanium, a titanium alloy, aluminum, or an aluminum alloy.

As titanium or a titanium alloy, exemplified are pure titanium, a Ti-Pd alloy, a Ti-Ta alloy, a Ti-Al alloy, a Ti-Ai-Sn alloy, a Ti-Al-V-Mo alloy, a Ti-Al-Sn-Zr-Mo-Si alloy, a Ti-Al-Zr-Mo-Sn alloy, a Ti-Al-V alloy, a Ti-Al-Sn-Zr-Mo alloy, a Ti-Al-V-Sn alloy, a Ti-V-Cr-Al alloy, etc. As aluminum or an aluminum alloy, exemplified are, in addition to pure aluminum, an Al-Cr-X alloy (where X represents an additional element such as Si, Mn, Mg, etc.), an Al-Mn-Y alloy (where Y represents an additional element such as Mg, Si, etc.), an Al-Mg-Z alloy (where Z represents an additional element such as Zn, Si, Cr, Mn, Mg, etc.), an Al-Si-W alloy (where W represents an additional element such as Mg, Cu, Cr, etc.).

<e> Then, by using a reactive-ion etching apparatus, the portion not covered by a mask (4) of the metallic thin film is removed by using plasma of the reactive etching gas, and the pattern of the mask (4) is transferred to the metallic thin film (2).

<f> The residual mask (4) is removed thereafter by an ordinary reactive-ion etching process using reactive gases such as flon ($CP_4$), carbon tetrachloride ($CCl_4$), etc.

Figure 2:
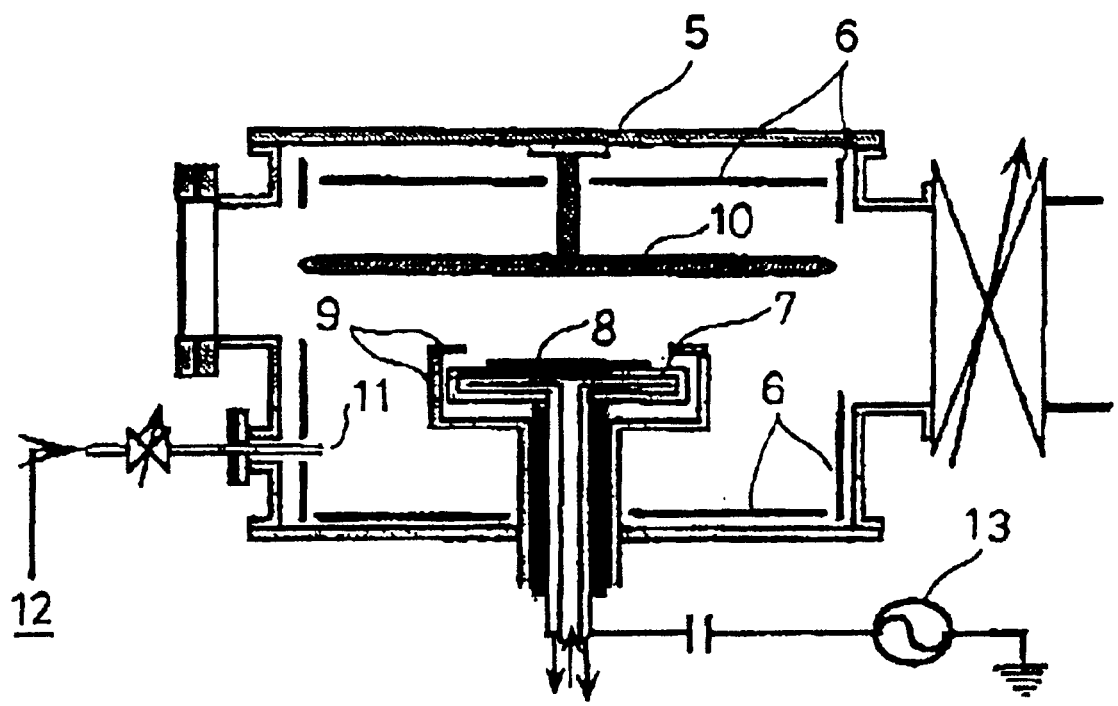
FIG. 2 is a cross section view of an example of a reactive ion etching apparatus suitably used in the dry etching according to the invention of the present application.

FIG. 2 is a cross section view of a reactive-ion etching apparatus suitably used in the dry etching according to the invention of the present application.

Referring to FIG. 2, a reaction vessel (5) is made of titanium or a titanium alloy, and the inner wall thereof is covered by an deposition protecting plate (6) made of titanium or a titanium alloy. Various types of structures that are placed inside the reaction vessel (5) and that are to be brought into contact with the plasma of the etching are also made of titanium or a titanium alloy.

The work place to be processed is attached and fixed on the surface of a sample holder (8) fixed to a water-soluble high frequency electrode (7). The surroundings of the high frequency electrode (7) is covered by a zero-potential shield (9), such that the high frequency electrode (7) itself may not be subjected to the etching reaction.

A counter electrode (10), which is larger in area as compared with the high frequency electrode, is provided at a predetermined distance from the upper side of the high frequency electrode (7). The counter electrode (10) is electrically connected to the reaction vessel (5) to maintain the zero potential.

The reaction vessel (5) is equipped with an etching gas inlet (11), so that the etching gas (12) may be introduced into the reaction vessel (5) with its flow rate adjusted through the etching gas inlet (11). The composition and the flow rate of the etching gas differ depending on, for instance, the reactive ion etching apparatus to be used, however, as the etching conditions for copper or a copper alloy, there can be preferably exemplified a total gas flow rate of 16 cc/min, comprising gaseous $NO_2$ and $NH_3$ each flown at a rate of 3 to 9 cc/min and 13 to 7 cc/min, respectively. More preferably, the etching gas is flown under a condition as such that the total gas flow rate is 16 cc/min, comprising gaseous $NO_2$ and $H_2$ each flown at a rate of 4 to 10 cc/min and 12 to 6 cc/min, respectively. For silver, gold, or an alloy containing as a main component at least one of these metals, for example, the etching gas is flown under a condition as such that the total gas flow rate is 16 cc/min, comprising gaseous $NO_2$ and $NH_3$ each flown at a rate of 7 to 14 cc/min and 9 to 2 cc/min, respectively. More preferably, the etching gas is flown under a conditions as such that the total gas flow rate is 16 cc/min, comprising gaseous $NO_2$ and $H_2$ each flown at a rate of 4 to 10 cc/min and 12 to 6 cc/min, respectively.

In carrying out the etching, the reaction vessel (5) is evacuated with a vacuum pump simultaneously with the introduction of an etching gas (12), such that the pressure inside of the reaction vessel (5) is maintained in a range of 0.1 to 10 mTorr, preferably, in a range of 5 to 6 mTorr. Then, a high voltage radio frequency power is applied at a proper power to the high frequency electrode (7) from a power supply (13) at a frequency of 13.56 MHz.

Then, the etching gas molecule introduced inside the reaction vessel (5) undergo dissociation and ionization to generate plasma. The generation of plasma concentrates at the aperture portion of the zero-potential shield (9), and the reaction ion etching proceeds on the work piece placed and fixed inside the shield. The etching rate increases approximately in proportion to the applied radio frequency power. However, since the damage applied to the processing object increases with the increase in the radio frequency power, the power applied to the electrode (7) is preferably set within the range from 50 to 150 W.

As a plasma generating apparatus, in addition to the capacitive coupling type plasma generating apparatus above, there can be used as inductive coupling type plasma generating apparatus, an electron cyclotron resonance type plasma generating apparatus, a helicon wave plasma generating apparatus, etc.

The dry etching according to the invention of the present application is described in further detail below by means of examples.

EXAMPLES

Example 1

A copper thin film was subjected to reactive ion etching in accordance with process steps described below.

Referring to FIG. 1,

<a> A 1 μm thick copper thin film (2) was formed on a glass substrate (1) by means of sputtering.

<b> After forming a film of resist (3) on the product above by coating, a resist pattern was formed by electron beam lithography.

<c> Then, a fine titanium mask (4) was formed.

<d> Residual resist (3) was removed to obtain a specimen.

<e> Subsequently, the specimen thus obtained was placed and fixed on a sample holder (8) provided inside a titanium reaction vessel (5) of a reactive-ion etching apparatus shown in FIG. 2, and the inside of the reaction vessel (5) was evacuated while supplying gaseous $NO_2$ and $NH_3$ at a flow rate of 7 cc/min and 8 cc/min, respectively, to maintain the inner pressure at 6 mTorr. Then, high frequency power was applied at a power of 50 W to generate plasma, and reactive ion etching was performed for 8 minutes.

<f> Thereafter, the titanium mask (4) remaining on the thus etched copper thin film (2) was removed by $CCl_4$ plasma.

Figure 3:
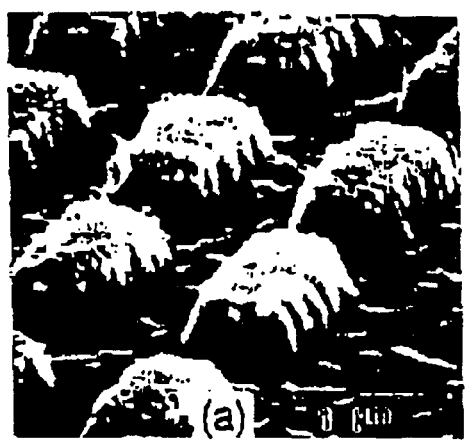
FIG. 3(*a*) to FIG. 3(*c*) are each an electron micrograph showing the state of a copper or a gold thin film after being subjected to the dry etching according to the invention of the present application.
Figure 3:
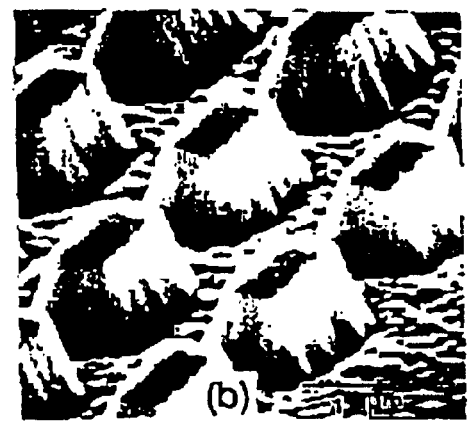
Figure 3:

The resulting product is shown in the electron micrograph given in FIG. 3(a).

The portion of the copper thin film not masked by the titanium mask alone was found to be selectively etched. The selectivity ratio with respect to the titanium mask was found to be approximately 10. Further, favorable anisotropy in etching was achieved, and the side wall was found to make an angle of 86° with respect to the bottom plane of the copper thin film. Furthermore, the etching rate was found to be 55 nm/min. It was confirmed that a highly efficient reactive ion etching was performed.

Example 2

A gold thin film was subjected to reactive ion etching in accordance with process steps similar to those described in Example 1.

The resulting product is shown in the electron micrograph given in FIG. 3(b).

The portion of the gold thin film not masked by the titanium mask alone was found to be selectively etched. The selectivity ratio with respect to the titanium mask was found to be the same as in the case of copper thin film described in Example 1, i.e., approximately 10. Further, favorable anisotropy in etching was achieved, and the side wall was found to make an angle of 83° with respect to the bottom plane of the gold thin film. Furthermore, the etching rate was found to be 70 nm/min. It was confirmed that a highly efficient reactive ion etching was performed.

Example 3

A silver thin film was subjected to reactive ion etching in accordance with process steps similar to those described in Example 1.

The portion of the silver thin film not masked by the titanium mask alone was found to be selectively etched. The selectivity ratio with respect to the titanium mask was found to be approximately 12. Further, favorable anisotropy in etching was achieved, and the side plane was found to make an angle of 86° with respect to the bottom plane of the silver thin film. Furthermore, the etching rate was found to be 82 nm/min. It was confirmed that a highly efficient reactive ion etching was performed.

Example 4

A copper thin film was subjected to reactive ion etching in accordance with process steps similar to those described in Example 1, except for using a gaseous mixture of $NO_2$ and $H_2$ as the etching gas.

More specifically, while flowing gaseous $NO_2$ and $H_2$ at a flow rate of 12 cc/min and 4 cc/min, respectively, the inside of the reaction vessel was evacuated to maintain the pressure at 5 mTorr, and high frequency wave was applied at a power of 50 W to perform reactive ion etching for 6 minutes.

The resulting product is shown in the electron micrograph given in FIG. 3(c).

The portion of the copper thin film not masked by the titanium mask alone was found to be selectively etched, and when compared it with the product obtained in Example 1, a sharper pattern was found to be formed. That is, this signifies that a smoother surface is obtained on the copper thin film resulting by the etching, and that the damage to the processing work piece is reduced. Furthermore, the shape of the side walls of the copper thin film was found to be sharper and smoother. This signifies that the resulting product has less re-deposition layer which the copper thin film removed by the etching causes by again deposit to the side walls.

The selectivity ratio with respect to the titanium mask was found to be approximately 12. The index of anisotropy in etching, i.e., the angle between the bottom plane and the side plane of the copper thin film, was found to be 86°. Furthermore, the etching rate was found to be 120 nm/min.

As a matter of course, the invention according to the present application is not limited by the example described above, and it should be understood that variations and modifications are acceptable on not only the types of the etching gases, but also the details of the etching, such as the constitution and the structure of the reactive ion apparatus, as well as the operation conditions, etc.

INDUSTRIAL APPLICABILITY

As described in detail above, in accordance with the present invention, fine processing of copper, silver, gold, or an alloy containing as a main component at least one of these metals, become possible by means of reactive-ion etching method. In addition to this, in accordance with the invention, there is provided a mask having excellent stability and free from corrosion by the plasma of the etching gases wherein the etching gases contain at least nitrogen oxide and are usable for copper, silver, gold, or an alloy containing as a main component at least one of these metals.

What is claimed is:

1. A dry etching method comprising etching a metallic surface of copper, silver, gold, or an alloy containing as a main component at least one of these metals by plasma of an etching gas containing a gaseous nitrogen oxide, hydrogen sulfide and ammonia while being reacted with the plasma.

2. A dry etching method as claimed in claim 1, wherein a mask material selected from the group consisting of titanium and a titanium alloy covers the metallic surface on etching.

3. A dry etching method comprising etching a metallic surface of copper, silver, gold, or an alloy containing as a main component at least one of these metals by plasma of an etching gas containing a gaseous nitrogen oxide and ammonia while being reacted with the plasma, wherein a mask material selected from the group consisting of titanium and a titanium alloy covers the metallic surface on etching.

4. A dry etching method as claimed in claim 3, wherein the etching gas further contains hydrogen sulfide.

* * * * *